(12) United States Patent
Brillouet et al.

(10) Patent No.: US 7,065,120 B2
(45) Date of Patent: Jun. 20, 2006

(54) INTEGRATED LASER WITH PEROT-FABRY CAVITY

(75) Inventors: François Brillouet, Clamart (FR); Jean-René Burie, Bruyeres le Chatel (FR)

(73) Assignee: Avanex Corporation, Fremont, CA (US)

(*) Notice: Subject to any disclaimer, the term of this patent is extended or adjusted under 35 U.S.C. 154(b) by 112 days.

(21) Appl. No.: 10/362,754

(22) PCT Filed: Jul. 1, 2002

(86) PCT No.: PCT/FR02/02280

§ 371 (c)(1),
(2), (4) Date: Feb. 26, 2003

(87) PCT Pub. No.: WO03/005511

PCT Pub. Date: Jan. 16, 2003

(65) Prior Publication Data

US 2003/0179796 A1    Sep. 25, 2003

(30) Foreign Application Priority Data

Jul. 2, 2001    (FR) .................................. 01 08734

(51) Int. Cl.
*H01S 5/00* (2006.01)
*H01S 3/115* (2006.01)

(52) U.S. Cl. ...................... 372/50.11; 372/12; 372/50.1
(58) Field of Classification Search .................. 372/50, 372/49, 43, 96, 102, 99, 20, 6, 26, 97, 50.1, 372/50.11, 12
See application file for complete search history.

(56) References Cited

U.S. PATENT DOCUMENTS

| | | | |
|---|---|---|---|
| 4,695,790 A * | 9/1987 | Mathis | 324/76.36 |
| 4,773,075 A * | 9/1988 | Akiba et al. | 372/50 |
| 4,977,567 A | 12/1990 | Hanke | |
| 5,144,637 A * | 9/1992 | Koch et al. | 372/50 |
| 5,463,647 A * | 10/1995 | Pan | 372/12 |
| 5,793,521 A * | 8/1998 | O'Brien et al. | 359/344 |
| 5,802,084 A * | 9/1998 | Bowers et al. | 372/18 |
| 5,905,745 A * | 5/1999 | Grubb et al. | 372/6 |
| 6,650,673 B1 * | 11/2003 | Hong et al. | 372/50 |
| 6,678,301 B1 * | 1/2004 | Eng et al. | 372/50.11 |

FOREIGN PATENT DOCUMENTS

JP    360187078    * 9/1985

OTHER PUBLICATIONS

Patent Abstracts of Japan, vol. 010, No. 027 (E-378), Feb. 4, 1986 corresponding to JP 60187078 (Matsushita Denki Sangyo KK) dated Sep. 24, 1985.

(Continued)

*Primary Examiner*—Armando Rodriguez
(74) *Attorney, Agent, or Firm*—Patterson & Sheridan, LLP

(57) ABSTRACT

A monolithic integrated component (10) comprises a plurality of sections (21, 22) including a section (21) constituting a laser having a cavity delimited by a partially reflecting reflector and at least one other section (22) adjacent said laser section (21). The partially reflecting reflector (11) is disposed between the laser section (21) and one of the adjacent sections (22) and is a Bragg reflector grating (11) that allows multimode operation of the laser (21).

11 Claims, 1 Drawing Sheet

OTHER PUBLICATIONS

K. C. Reichmann et al, "2.5 GB/S Transmission Over 674 KM at Multiple Wavelengths using a tunable DBR Laser with an Integrated Electroabsorption Modulator", IEEE Photonics Technology Letters, IEEE Inc., New York, US, vol. 5, No. 9, Sep. 1, 1993, pp. 1098-1100, XP000414187.

Patent Abstracts of Japan, vol. 012, No. 362 9E-663) Sep. 28, 1988 corresponding to JP 63 116489 A (Mitsubishi Electric Corp) dated May 20, 1988.

H. Bissessur et al. "WDM Operation of a Hybrid Emitter Integrating a Wide-Bandwidth on Chip-Mirror", IEEE Journal of Selected Topics in Quantum Electronics, IEEE Service Center, US, vol. 5, No. 3, May 1999, pp. 476-479, XP000930527.

R. M. Lammert et a, "MQW DBR Lasers with Monolithically Integrated External Cavity Electroabosrption Modulators Fabricated without Modification of the Active Region", IEEE Photonics Technology Letters, IEEE, Inc. NY, US, vol. 9, No. 5 May 1, 1997, pp. 566-568 XP000677326.

* cited by examiner

INTEGRATED LASER WITH PEROT-FABRY CAVITY

TECHNICAL FIELD

The field of the invention is that of monolithic integrated components having a plurality of sections including a section constituting a Fabry-Perot cavity laser and at least one other section adjacent said laser section. It relates to the production of a mirror between the laser and an adjacent section.

PRIOR ART

In a device including a laser and a modulator, the light emitted by the laser is coupled into the modulator by means of an optical fiber, for example. The temperatures of the laser and the modulator are usually controlled to guarantee monomode operation of the laser. For long-haul transmission it is important for the emitted wavelength to remain constant. To reinforce monomode operation a semi-reflecting face constituting an exit face of a Fabry-Perot cavity of the laser is treated so that it is reflective at the operating wavelength of the laser.

BRIEF DESCRIPTIONS OF THE INVENTION

The present invention relates to a laser and an associated component, for example a modulator, when monomode operation of the laser is not essential, for example a laser used for short-haul transmission over distances of the order of 2 km or less. This kind of laser does not require temperature control. However, because the laser is not temperature-controlled, operation is no longer monomode and it is important for the semi-reflecting exit mirror to allow multimode operation. To this end the reflector must have a flat reflectivity response, at least for the wavelengths liable to be emitted by the laser at all operating temperatures at which it is likely to operate.

To this end, the invention provides a monolithic integrated component comprising a plurality of sections including a section constituting a laser having a cavity delimited by an external face of the component and by a partially reflecting reflector and another section adjacent said laser section, which component is characterized in that the partially reflecting reflector is disposed between the laser section and said adjacent other section and in that the reflector allows multimode operation of the laser.

In one advantageous embodiment the reflector is a Bragg grating allowing multimode operation.

BRIEF DESCRIPTION OF THE DRAWINGS

The invention is described next with reference to the accompanying drawings, in which.

DESCRIPTION OF EMBODIMENTS

Figure 1:
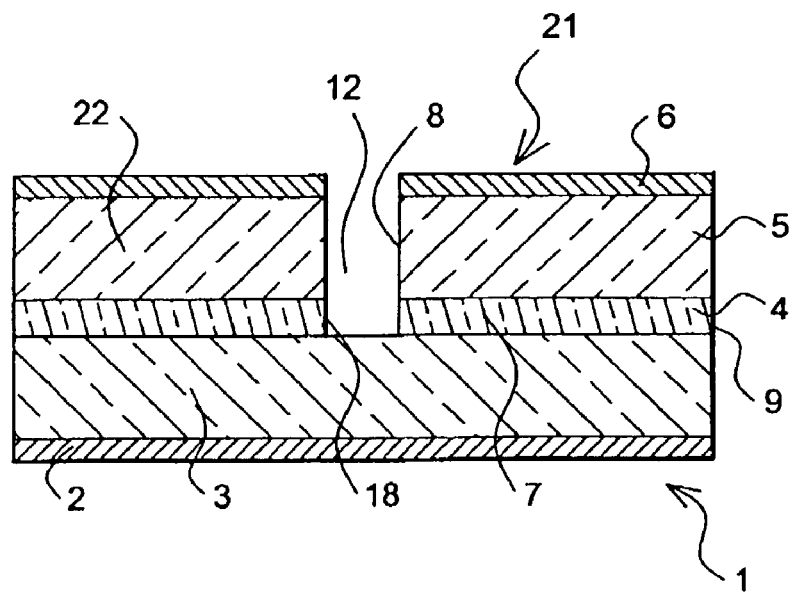
FIG. 1 is a diagram showing a first embodiment of a component of the invention in section on a plane perpendicular to the plane of the layers and parallel to a direction of propagation of light between two adjacent sections of the component.

A monolithic component 1 in accordance with the invention as shown in FIG. 1 comprises two sections 21, 22, of which a first section 21 is a Fabry-Perot cavity laser and the second section 22 is a subcomponent of the component 1. The semiconductor laser first section 21 is made up of a stack of layers 2, 3, 4, 5, 6 on a substrate and including an active layer 4 of GaInAsP, for example, and electrical and optical confinement layers 3, 5. The stack of layers is terminated at the top and at the bottom by respective surface electric contact layers 6 and 2 that are used to bias the laser section 21. The laser layer 4 is bordered above and below by the confinement layers 5 and 3, respectively.

A laser cavity 7 is formed in a manner known in the art by cutting the layers, including the active layer 4, thereby producing mirror faces 8 and 9 that are treated to have the necessary coefficients of reflection, so that the active layer 4 is in a Fabry-Perot cavity 7. The laser section 21 is integrated on the same substrate as the other section 22, which forms a subcomponent, for example a modulator, an amplifier or a filter. One of the mirror faces 9 of the cavity 7 is an external face of the component, obtained by cleaving, for example, and the opposite mirror face 8 constitutes an exit face which in practice is obtained by etching at 12 the layers running from one of the surface layers of the component, for example the layer 6, as far as the active layer 4, and possibly beyond it.

In accordance with the invention, the etched exit face 8 receives a reflective treatment so that its reflectivity response is flat at least for the operating wavelengths liable to be delivered by the laser over the range of temperatures in which the laser is likely to operate. The operation of the laser is therefore multimode and it is not necessary to control the laser temperature using one of the usual control devices.

It must nevertheless be pointed out that, in an embodiment of this kind, because of the etching at 12, two reflective faces 8 and 18 are necessarily created, comprising a required first face 8, i.e. the face delimiting the Fabry-Perot cavity 7, and a second face 18 that is inevitably created, i.e. the face of the second section 22 facing the laser cavity 7 on the substrate. Because of this, laser light is not reflected towards the cavity 7 by only one mirror (the mirror 8), but by the two mirrors 8 and 18. It is then necessary to control the reflectivity of the two mirrors 8 and 18 and also that of the optical path between them, for example to obtain an even integer number of half-wavelengths. It is difficult to achieve the required accuracy with existing etching techniques. Also, etching introduces a constant distance between the reflectors 8 and 18 which is reflected in a phase shift that varies as a function of the operating wavelength. Because of this, the adjustment is correct for only one of the operating wavelengths of the cavity 7, for example the wavelength corresponding to the most probable operating temperature, and is degraded at other operating temperatures.

Figure 2:
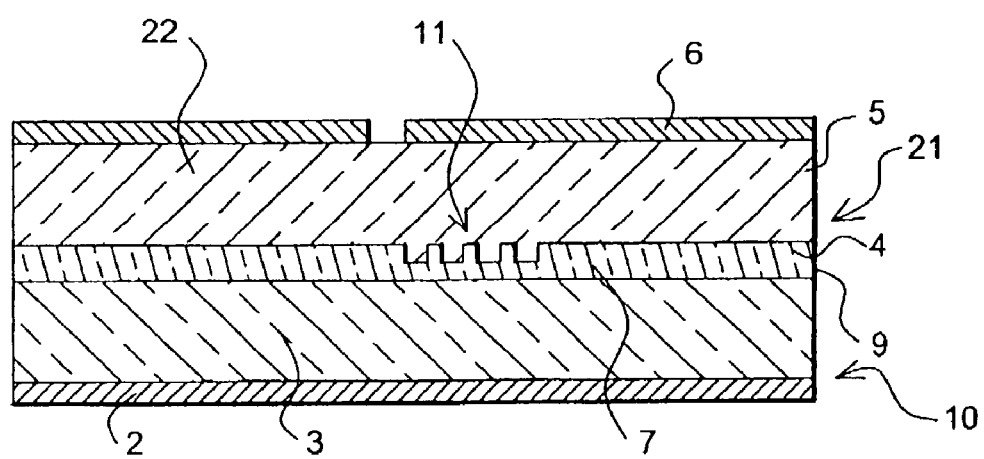
FIG. 2 is a diagram showing a preferred embodiment of a component of the invention in section on a plane perpendicular to the plane of the layers and parallel to a direction of propagation of light between two adjacent sections of the component.

The preferred embodiment shown in FIG. 2 has the advantages of the first embodiment without the drawbacks thereof just described.

FIG. 2 shows a monolithic component 10. The architecture of the component 10 is analogous to that of the component 1 shown in FIG. 1. In FIG. 2, items having the same function as items shown in FIG. 1 are identified by the same reference number, and these components are not described again. The difference between the component 1 shown in FIG. 1 and the component 10 constituting the preferred embodiment of the invention shown in FIG. 2 lies in the junction between the two sections 21 and 22, in that the etching at 12 is no longer present. It is replaced by a reflective Bragg grating 11 produced by a method known in the art after depositing the active layer 4. The depth to which the lines constituting the grating are etched is such that the bandwidth of the grating allows multimode operation of the laser cavity 7. The bandwidth can be of the order of ten to a few tens of nanometers, for example 10 to 20 nanometers. Although the bandwidth of a cleaved face can be of the order of a few hundred nanometers, a bandwidth of a few tens of nanometers covering at least the bandwidth of the subcomponent constituting the second section 22 will not generally lead to any penalty. The reflectivity of this kind of array in the operating band can be of the order of 20 to 25%.

In the example shown in FIG. 2, the second section 22 integrated on the component 10 is a subcomponent known in the art, for example an electro-absorbant electro-optical modulator.

The invention claimed is:

1. A monolithic integrated component comprising:
    a laser section having a cavity delimited by a mirror face and by a Bragg reflector grating, wherein the mirror face is an external face of the monolithic integrated component; and
    a second section disposed adjacent said laser section, wherein the positioning of the Bragg reflector grating between the laser section and said second section and the construction of the Bragg reflector grating allows multimode operation of the laser.

2. The monolithic integrated component according to claim 1, characterized in that the Bragg reflector grating has a bandwidth from one to a few tens of nanometers.

3. The monolithic integrated component according to claim 2, characterized in that the Bragg reflector grating has a reflectivity of approximately 20 to 25% for wavelengths in its bandwidth.

4. The monolithic integrated component according to claim 1, characterized in that the second section adjacent the laser first section is an electro-optical modulator.

5. The monolithic integrated component according to claim 1, characterized in that the Bragg reflector grating is constructed and arranged to have a flat reflectivity response at the operating wavelength of the laser section.

6. A monolithic integrated component, comprising:
    a laser section having a cavity defined by a Bragg reflector grating and a mirror face, the Bragg reflector grating constructed and arranged to have a flat reflectivity response at the operating wavelength of the laser section, and the mirror face an external face of the monolithic integrated component; and
    an electro-optical modulator disposed adjacent the laser section, wherein the arrangement of the Bragg reflector grating between the laser section and the electra-optical modulator allows multimode operation of the laser section.

7. A monolithic integrated component, comprising:
    a laser section having a cavity defined by a Bragg reflector grating and a mirror face, wherein the mirror face is an external face of the monolithic integrated component; and
    a second section disposed adjacent the laser section, wherein the position of the Bragg reflector grating between the laser section and the second section in conjunction with a predetermined bandwidth of the Bragg reflector grating allows multimode operation of the laser section.

8. The monolithic integrated component according to claim 7, characterized in that the second section is an electro-optical modulator.

9. The monolithic integrated component according to claim 7, characterized in that the second section is an amplifier.

10. The monolithic integrated component according to claim 7, characterized in that the second section is a filter.

11. The monolithic integrated component according to claim 7, characterized in that the Bragg reflector grating has a bandwidth of 10 to 20 nanometers.

* * * * *